(12) United States Patent
Wakahara et al.

(10) Patent No.: US 10,796,962 B2
(45) Date of Patent: Oct. 6, 2020

(54) SEMICONDUCTOR WAFER PROCESSING METHOD

(71) Applicant: DISCO CORPORATION, Tokyo (JP)

(72) Inventors: Masatoshi Wakahara, Tokyo (JP); Frank Wei, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/456,011

(22) Filed: Jun. 28, 2019

(65) Prior Publication Data

US 2020/0020585 A1 Jan. 16, 2020

(30) Foreign Application Priority Data

Jul. 10, 2018 (JP) .................................. 2018-130981

(51) Int. Cl.
| | | |
|---|---|---|
| *H01L 21/78* | (2006.01) | |
| *H01L 21/3065* | (2006.01) | |
| *H01L 21/308* | (2006.01) | |
| *H01L 21/02* | (2006.01) | |
| *H01L 23/00* | (2006.01) | |
| *H01L 21/268* | (2006.01) | |
| *H01L 21/283* | (2006.01) | |
| *H01L 21/304* | (2006.01) | |
| *H01L 21/31* | (2006.01) | |

(52) U.S. Cl.
CPC .......... *H01L 21/78* (2013.01); *H01L 21/0206* (2013.01); *H01L 21/268* (2013.01); *H01L 21/308* (2013.01); *H01L 21/3065* (2013.01); *H01L 24/11* (2013.01); *H01L 21/283* (2013.01); *H01L 21/3043* (2013.01); *H01L 21/31* (2013.01); *H01L 24/13* (2013.01); *H01L 2224/1145* (2013.01); *H01L 2224/1146* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01)

(58) Field of Classification Search
None
See application file for complete search history.

(56) References Cited

U.S. PATENT DOCUMENTS

| | | | | |
|---|---|---|---|---|
| 6,420,245 B1 * | 7/2002 | Manor | ............... | B23K 26/0093 438/460 |
| 8,993,414 B2 * | 3/2015 | Eaton | ..................... | H01L 21/78 438/465 |

(Continued)

FOREIGN PATENT DOCUMENTS

JP 2009021476 A 1/2009

*Primary Examiner* — Andres Munoz
(74) *Attorney, Agent, or Firm* — Greer Burns & Crain Ltd.

(57) ABSTRACT

A semiconductor wafer processing method includes a step of forming a laser processed groove on the front side of a semiconductor wafer along each division line, a step of forming a mask layer on a protective layer except in an area above a metal electrode formed in each device on the front side of the wafer, a first etching step of etching the protective layer by using the mask layer to expose each metal electrode, a second etching step of etching the inner surface of each laser processed groove by using the mask layer used in the first etching step, thereby expanding each laser processed groove, and a dividing step of dividing the wafer along each laser processed groove expanded in the second etching step.

6 Claims, 15 Drawing Sheets

(56) References Cited

U.S. PATENT DOCUMENTS

| | | | |
|---|---|---|---|
| 2003/0124771 A1* | 7/2003 | Maiz | H01L 21/3043 438/113 |
| 2005/0035100 A1* | 2/2005 | Genda | B23K 26/40 219/121.72 |
| 2005/0082651 A1* | 4/2005 | Farnworth | H01L 21/78 257/678 |
| 2005/0101108 A1* | 5/2005 | Genda | H01L 21/78 438/462 |
| 2005/0139962 A1* | 6/2005 | Dani | H01L 21/78 257/620 |
| 2009/0191690 A1* | 7/2009 | Boyle | H01L 21/3065 438/462 |
| 2012/0322234 A1* | 12/2012 | Yalamanchili | B23K 26/364 438/462 |
| 2012/0322239 A1* | 12/2012 | Singh | B23K 26/36 438/462 |
| 2012/0329246 A1* | 12/2012 | Finn | H01L 21/67207 438/462 |
| 2014/0015112 A1* | 1/2014 | Watanabe | H01L 23/00 257/620 |
| 2014/0273401 A1* | 9/2014 | Lei | H01L 21/3081 438/462 |
| 2017/0140989 A1* | 5/2017 | Tabuchi | H01L 21/268 |

* cited by examiner

S30

S60

S80-2

SEMICONDUCTOR WAFER PROCESSING METHOD

BACKGROUND OF THE INVENTION

Field of the Invention

The present invention relates to a semiconductor wafer processing method for dividing a semiconductor wafer having a plurality of semiconductor devices separated from each other by a plurality of division lines formed on the front side of the semiconductor wafer, in which the semiconductor wafer is divided along each division line by the method.

Description of the Related Art

Usually, a functional layer is formed on the front side of a semiconductor wafer to form a plurality of semiconductor devices. This functional layer in each semiconductor device includes a distribution layer, a metal electrode formed above the distribution layer, and interlayer insulating films sandwiching the distribution layer and the metal electrode. In recent years, a low-permittivity material (so-called low-k material) has been used as the material of each interlayer insulating film. By using the low-k material, the processing speed of each semiconductor device can be increased. However, since the low-k material is a porous material, the strength of the low-k film is lower than that of a thermal silicon oxide film ($SiO_2$). Accordingly, in cutting the semiconductor wafer by using a cutting blade to thereby divide the semiconductor wafer, there is a problem of delamination of the low-k films. To cope with this problem, there has been proposed a technique rather than cutting by the use of a cutting blade only. In this technique, laser ablation is performed to the functional layer including the low-k films to thereby partially remove the functional layer, thereby forming a laser processed groove along each division line. Thereafter, the semiconductor wafer is cut along each laser processed groove by using a cutting blade in such a manner that the cutting blade is located between the opposite side walls of each laser processed groove (see Japanese Patent Laid-open No. 2009-21476, for example). By adopting this technique, it is possible to solve the above problem that the delamination of the low-k films may occur in dividing the semiconductor wafer.

However, due to the heat generated in forming each laser processed groove, there arises a problem such that a modified layer may be formed in the low-k films in the vicinity of each laser processed groove and a distorted layer having cracks on the order of micrometers may be formed at the bottom of each laser processed groove. There is a possibility that the modified layer and the distorted layer may have an adverse effect on the operation of each semiconductor device. Further, there is another possibility that the modified layer and the distorted layer may reduce the die strength of each device chip obtained by dividing the semiconductor wafer. It is therefore desirable to remove the modified layer and the distorted layer from the semiconductor wafer.

SUMMARY OF THE INVENTION

Usually, each laser processed groove is formed on the functional layer after performing a step of exposing the metal electrodes included in the functional layer from the interlayer insulating films or after performing a step of forming a bump electrically connected to each metal electrode exposed from the interlayer insulating films. Thereafter, the semiconductor wafer is cut along each laser processed groove by using a cutting blade to thereby divide the semiconductor wafer. In this case, plasma etching may be performed after forming each laser processed groove and before dividing the semiconductor wafer, thereby removing the modified layer and the distorted layer. However, it is necessary to additionally perform a step of forming a mask layer (e.g., photoresist layer) for covering an area not to be removed by the plasma etching. As a result, additional cost is incurred.

It is therefore an object of the present invention to provide a semiconductor wafer processing method which can remove the modified layer and the distorted layer from the semiconductor wafer without adding a mask layer forming step after forming each laser processed groove and before dividing the semiconductor wafer.

In accordance with an aspect of the present invention, there is provided a semiconductor wafer processing method including: a device forming step of forming a functional layer on a front side of a semiconductor wafer, the functional layer having a first area where a plurality of semiconductor devices are formed and a second area where a plurality of division lines for separating the plurality of semiconductor devices from each other are formed, each device including a distribution layer and a metal electrode formed above the distribution layer; a protective layer forming step of forming an insulating protective layer on a front side of the functional layer to fully cover the front side of the functional layer with the protective layer, thereby forming a device wafer having the semiconductor wafer, the functional layer, and the protective layer; a laser processed groove forming step of applying a laser beam having an absorption wavelength to the functional layer and the semiconductor wafer along each division line to partially remove the semiconductor wafer, the protective layer, and the functional layer, and thereby expose the front side of the semiconductor wafer, thereby forming a laser processed groove along each division line on a front side of the device wafer; a mask layer forming step of forming a mask layer on a front side of the protective layer except in an area above each metal electrode; a first etching step of performing plasma etching using a first gas through the mask layer to the protective layer, thereby exposing each metal electrode; a second etching step of performing plasma etching using a second gas to each laser processed groove through the mask layer used in the first etching step, thereby partially removing the functional layer and the semiconductor wafer exposed from the mask layer to thereby expand each laser processed groove both along its width and along its depth; and a dividing step of dividing the semiconductor wafer along each laser processed groove expanded in the second etching step, thereby obtaining a plurality of device chips respectively including the plurality of semiconductor devices.

Preferably, the mask layer formed in the mask layer forming step has an edge portion in the vicinity of each laser processed groove, the edge portion of the mask layer being retracted from an edge portion of each laser processed groove, and an upper surface of the protective layer in the vicinity of each laser processed groove is exposed from the mask layer.

Preferably, the semiconductor wafer processing method further includes: a water-soluble resin layer forming step of forming a water-soluble resin layer on the front side of the device wafer after performing the protective layer forming step and before performing the laser processed groove forming step; and a cleaning step of cleaning the device wafer after performing the laser processed groove forming step and before performing the mask layer forming step, thereby removing the water-soluble resin layer together with debris generated in the laser processed groove forming step.

Preferably, the dividing step includes a cutting step of using a cutting blade to cut the semiconductor wafer along each laser processed groove expanded in the second etching step.

Preferably, each laser processed groove expanded in the second etching step has a depth from the front side of the semiconductor wafer to a position not reaching a back side of the semiconductor wafer, the depth being larger than a finished thickness of each device chip, and the dividing step including a grinding step of grinding the back side of the semiconductor wafer until the thickness of the semiconductor wafer becomes the finished thickness, thereby dividing the semiconductor wafer along each laser processed groove expanded in the second etching step.

Preferably, the semiconductor wafer processing method further includes a bump forming step of forming a bump on each metal electrode exposed in the first etching step.

As described above, the semiconductor wafer processing method according to the present invention includes the mask layer forming step to be performed after performing the laser processed groove forming step. In the mask layer forming step, the protective layer is masked by the mask layer except in an area above each metal electrode and except in an area in the vicinity of each laser processed groove. In the next first etching step, plasma etching is performed to the protective layer by using the mask layer, thereby partially removing the protective layer to expose each metal electrode. In the next second etching step, plasma etching is performed to each laser processed groove by using the mask layer used in the first etching step, thereby partially removing the functional layer and the semiconductor wafer exposed to each laser processed groove. In this manner, a modified layer formed in the functional layer (interlayer insulating films) and a distorted layer formed in the semiconductor wafer in applying a laser beam can be removed by the plasma etching using the mask layer used for the exposure of each metal electrode. That is, it is unnecessary to perform any additional mask layer forming step intended to remove the modified layer and the distorted layer after performing the laser processed groove forming step and before performing the dividing step.

The above and other objects, features, and advantages of the present invention and the manner of realizing them will become more apparent, and the invention itself will best be understood from a study of the following description and appended claims with reference to the attached drawings showing some embodiments of the invention.

DETAILED DESCRIPTION OF THE PREFERRED EMBODIMENTS

Figure 1A:
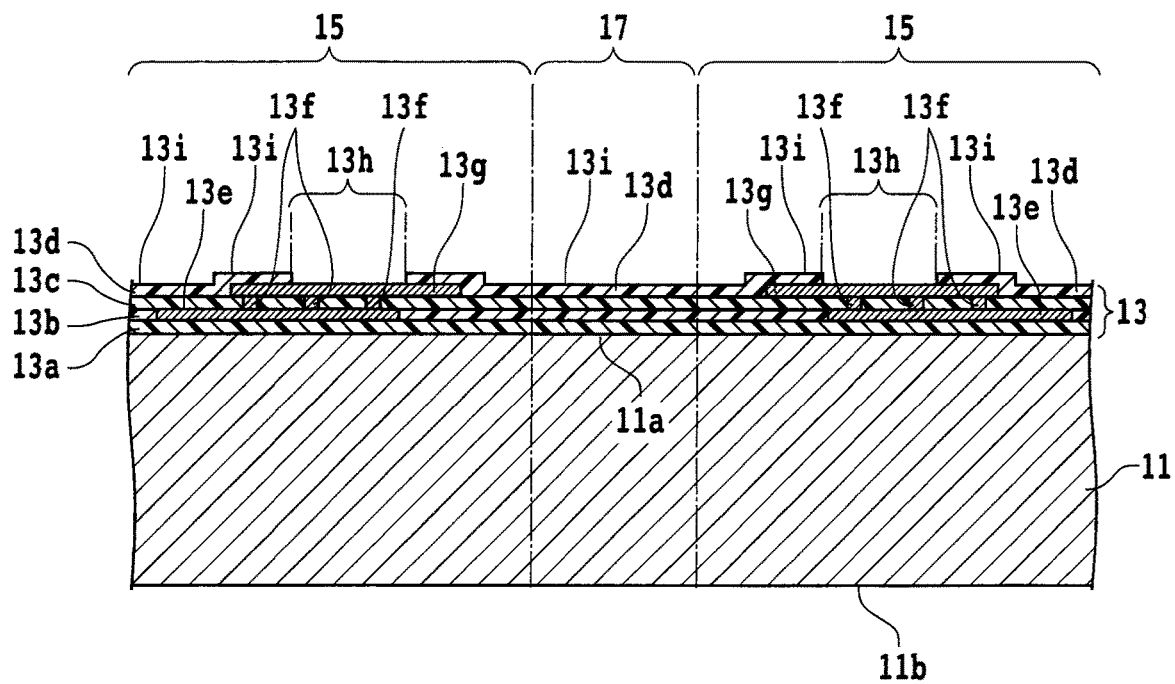
FIG. 1A is a sectional view of a semiconductor wafer and a functional layer formed on the front side of the semiconductor wafer, illustrating a device forming step (S10) in a semiconductor wafer processing method according to a first preferred embodiment of the present invention.
Figure 12:
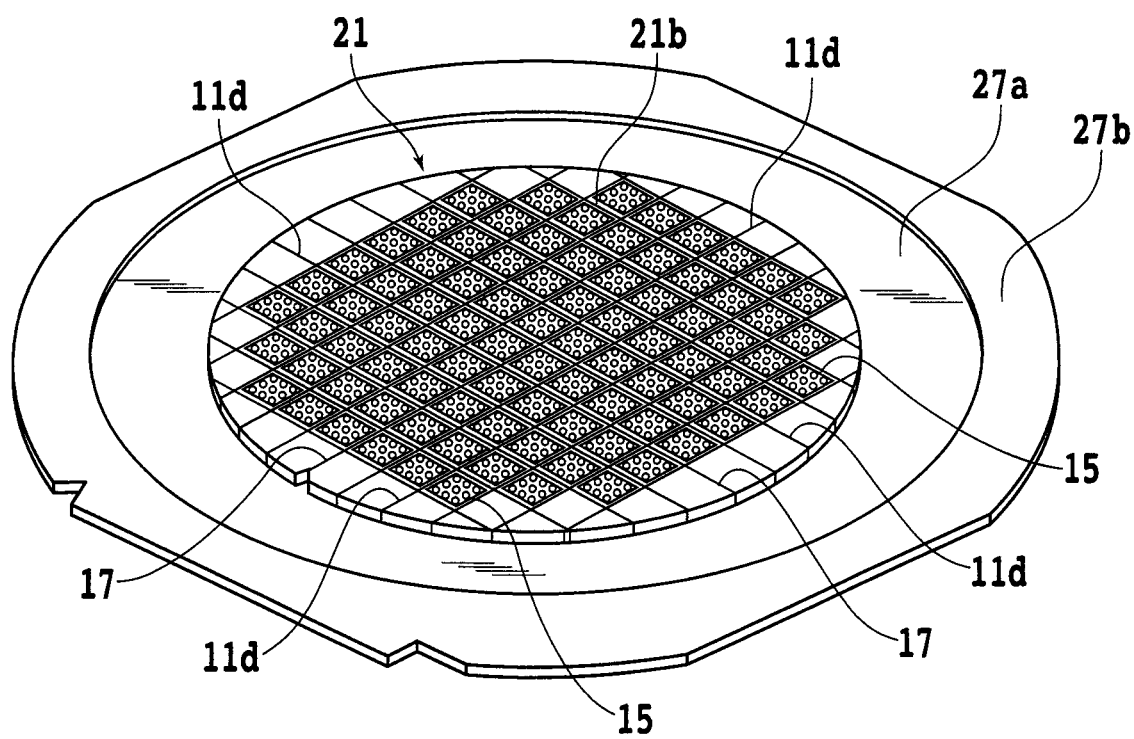
FIG. 12 is a perspective view of a wafer unit having the device wafer, a support tape, and an annular frame.
Figure 13:
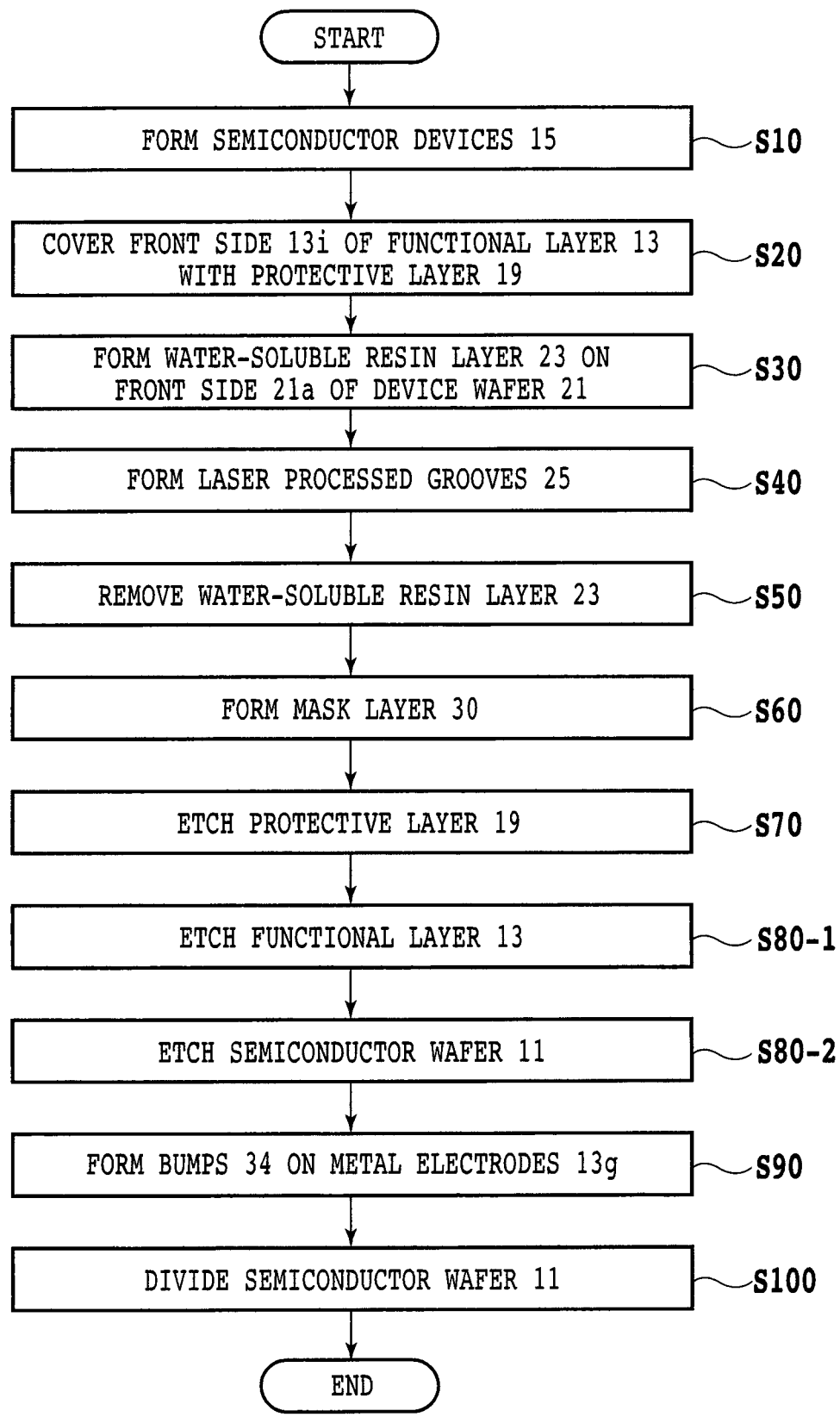
FIG. 13 is a flowchart illustrating the semiconductor wafer processing method according to the first preferred embodiment.

There will now be described a processing method for a semiconductor wafer 11 according to a first preferred embodiment of the present invention with reference to FIGS. 1A to 12 and FIG. 13. FIGS. 1A to 12 are views for illustrating the processing method according to the first preferred embodiment, and FIG. 13 is a flowchart illustrating the processing method according to the first preferred embodiment. FIG. 1A is a sectional view of the semiconductor wafer 11 and a functional layer 13, illustrating a device forming step (S10). The structure of the semiconductor wafer 11 and the functional layer 13 will now be described with reference to FIG. 1A. The semiconductor wafer 11 is formed of a semiconductor such as silicon. The semiconductor wafer 11 is a disk-shaped member having a front side 11a and a back side 11b opposite to the front side 11a. The semiconductor wafer 11 has a thickness of approximately 500 to 1000 μm as the distance from the front side 11a to the back side 11b. A plurality of functional elements (not illustrated) such as integrated circuits (ICs) and large-scale integrated circuits (LSIs) are formed on the front side 11a of the semiconductor wafer 11 (in the upper surface of the semiconductor wafer 11). The semiconductor wafer 11 is not limited in its material, shape, structure, and size, for example. For example, the semiconductor wafer 11 may be replaced by any semiconductor substrate formed of gallium arsenide (GaAs) or silicon carbide (SiC), for example, instead of silicon. Further, the functional elements are not limited in kind, number, shape, structure, size, and layout, for example.

The functional layer 13 is formed on the front side 11a of the semiconductor wafer 11. The functional layer 13 includes a first insulating film 13a. The first insulating film 13a is in contact with the front side 11a of the semiconductor wafer 11. The first insulating film 13a is a low-permittivity insulator film (so-called low-k film). Examples of the low-k film include oxide films such as carbon containing silicon oxide films (SiOCH films), inorganic films formed of inorganic materials such as fluorine containing silicon oxide (SiOF) and boron containing silicon oxide (SiOB), and organic films formed of organic materials such as polyimide and parylene. The inorganic low-k film is formed by plasma-enhanced chemical vapor deposition (plasma CVD), for example. The organic low-k film is formed by a coating process using a spin coater, for example.

The first insulating film 13a has a plurality of through holes (not illustrated) extending from the upper surface of the first insulating film 13a to the lower surface thereof. These through holes of the first insulating film 13a are formed by a photolithography step and an etching step. A plurality of distribution layers 13e are formed on the first insulating film 13a in contact therewith. These distribution layers 13e are metal layers formed of copper (Cu) or aluminum (Al), for example, in which the metal layers are formed by a sputtering step, for example. In the step of forming the distribution layers 13e, vias (not illustrated) are formed in the through holes of the first insulating film 13a. Accordingly, the distribution layers 13e are connected through the vias to the front side 11a of the semiconductor wafer 11. At the same level as that of the distribution layers 13e, a second insulating film 13b is formed in contact with the first insulating film 13a. The second insulating film 13b is also a low-k film formed similarly to the first insulating film 13a. The second insulating film 13b functions to electrically isolate the distribution layers 13e from each other at the same level.

A third insulating film 13c is formed on the second insulating film 13b and the distribution layers 13e. The third insulating film 13c is also a low-k film formed similarly to the first insulating film 13a. The third insulating film 13c has a plurality of through holes extending from the upper surface of the third insulating film 13c to the lower surface thereof. At the same level as that of the third insulating film 13c, a plurality of vias 13f are formed in contact with the distribution layers 13e. The vias 13f are formed in the through holes of the third insulating film 13c in a subsequent step of forming a plurality of metal electrodes 13g to be described later. The vias 13f are connected to the distribution layers 13e. The metal electrodes 13g are formed on the vias 13f in contact therewith. The metal electrodes 13g are electrodes formed similarly to the distribution layers 13e. The metal electrodes 13g are connected to the vias 13f formed in the through holes of the third insulating film 13c. Accordingly, the metal electrode 13g formed above each distribution layer 13e is electrically connected through the corresponding vias 13f, the corresponding distribution layer 13e, and the corresponding vias (not illustrated) to the corresponding functional element formed on the front side 11a of the semiconductor wafer 11.

A fourth insulating film 13d is formed on the metal electrodes 13g and the third insulating film 13c in contact therewith. The fourth insulating film 13d has a plurality of openings 13h for partially exposing the metal electrodes 13g. The fourth insulating film 13d is also a low-k film formed similarly to the first insulating film 13a. The functional layer 13 and the semiconductor wafer 11 are stacked to form a stacked member including a plurality of semiconductor devices 15. Each semiconductor device 15 corresponds to an area including the semiconductor wafer 11, the functional layer 13, and the predetermined functional element. Any adjacent ones of the plural semiconductor devices 15 are spaced from each other by a predetermined distance in a plane perpendicular to the thickness direction of the semiconductor wafer 11. Each semiconductor device 15 is substantially rectangular as viewed in plan (see FIG. 2). The periphery of each semiconductor device 15 is positioned outside the periphery of the corresponding metal electrode 13g.

A division line 17 (street) is formed between any adjacent ones of the plural semiconductor devices 15. That is, the division line 17 functions as a boundary between the adjacent semiconductor devices 15. Each division line 17 is positioned on the functional layer 13 and has a predetermined width in a direction perpendicular to the thickness direction of the semiconductor wafer 11. As illustrated in FIG. 1A, the functional layer 13 in each division line 17 does not include the distribution layers 13e, the vias 13f, and the metal electrodes 13g in this preferred embodiment. As a modification, the functional layer 13 in each division line 17 may include a test circuit called test element group (TEG).

The device forming step (S10) will now be described. First, the first insulating film 13a is formed on the semiconductor wafer 11, and the through holes are formed in the first insulating film 13a.

Thereafter, the distribution layers 13e are formed on the first insulating film 13a, and the vias are formed in the through holes of the first insulating film 13a. Thereafter, the second insulating film 13b is formed. Thereafter, the third insulating film 13c is formed, and the through holes are formed in the third insulating film 13c. Thereafter, the metal electrodes 13g are formed on the third insulating film 13c, and the vias 13f are formed in the through holes of the third insulating film 13c. As a modification, the metal electrodes 13g and the vias 13f may be formed in different processes. Thereafter, the fourth insulating film 13d is formed, and the openings 13h are formed in the fourth insulating film 13d. In this preferred embodiment, after performing the device forming step (S10), the front side 13i (upper surface) of the functional layer 13 (i.e., the upper surface of the fourth insulating film 13d and the metal electrodes 13g exposed to the openings 13h) is covered with an insulating protective layer 19 (passivation layer), thereby forming a device wafer 21. In this preferred embodiment, the stacked member including the semiconductor wafer 11, the functional layer 13, and the protective layer 19 is referred to as the device wafer 21.

Figure 1B:
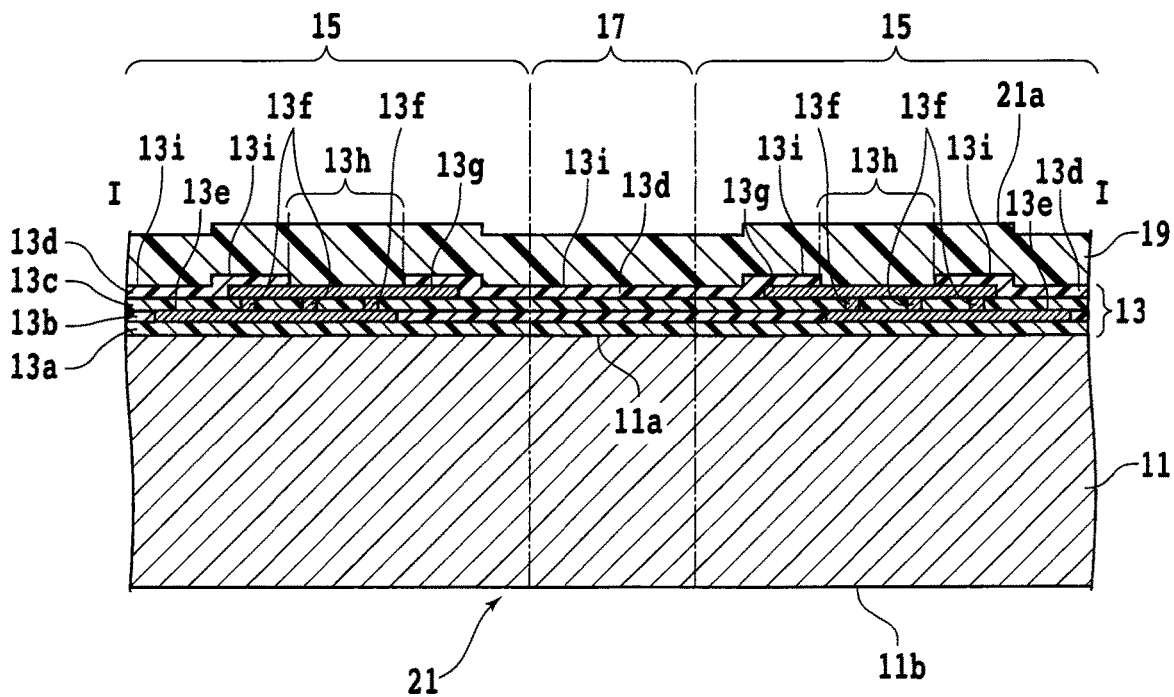
FIG. 1B is a sectional view of a device wafer having the semiconductor wafer, the functional layer, and a protective layer formed on the front side of the functional layer, illustrating a protective layer forming step (S20) according to the first preferred embodiment.
Figure 2:
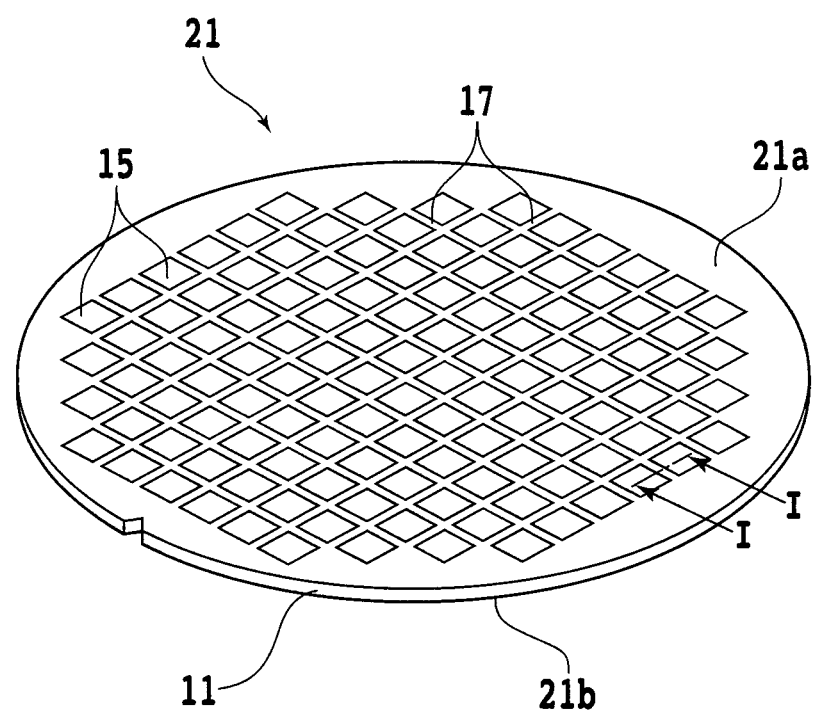
FIG. 2 is a perspective view of the device wafer illustrated in FIG. 1B.

FIG. 1B is a sectional view of the device wafer 21, illustrating a protective layer forming step (S20). In this preferred embodiment, the protective layer 19 is formed of polyimide. However, the material of the protective layer 19 is not limited to polyimide, but any other passivation materials such as polyamide and polyimideamide may be used as the material of the protective layer 19. In the protective layer forming step (S20), a spin coater is used to apply polyimide to the fourth insulating film 13d and the metal electrodes 13g. Thereafter, the polyimide applied is baked to form the protective layer 19. The whole of the device wafer 21 processed by the protective layer forming step (S20) is illustrated in FIG. 2. FIG. 2 is a perspective view of the device wafer 21. FIG. 1B is a cross section of a part of the device wafer 21 as taken along the line I-I in FIG. 2. The upper surface of the protective layer 19 illustrated in FIG. 1B corresponds to the front side 21a of the device wafer 21 illustrated in FIG. 2. In FIG. 2, the back side of the device wafer 21 corresponds to the back side 11b of the semiconductor wafer 11.

Figure 3:
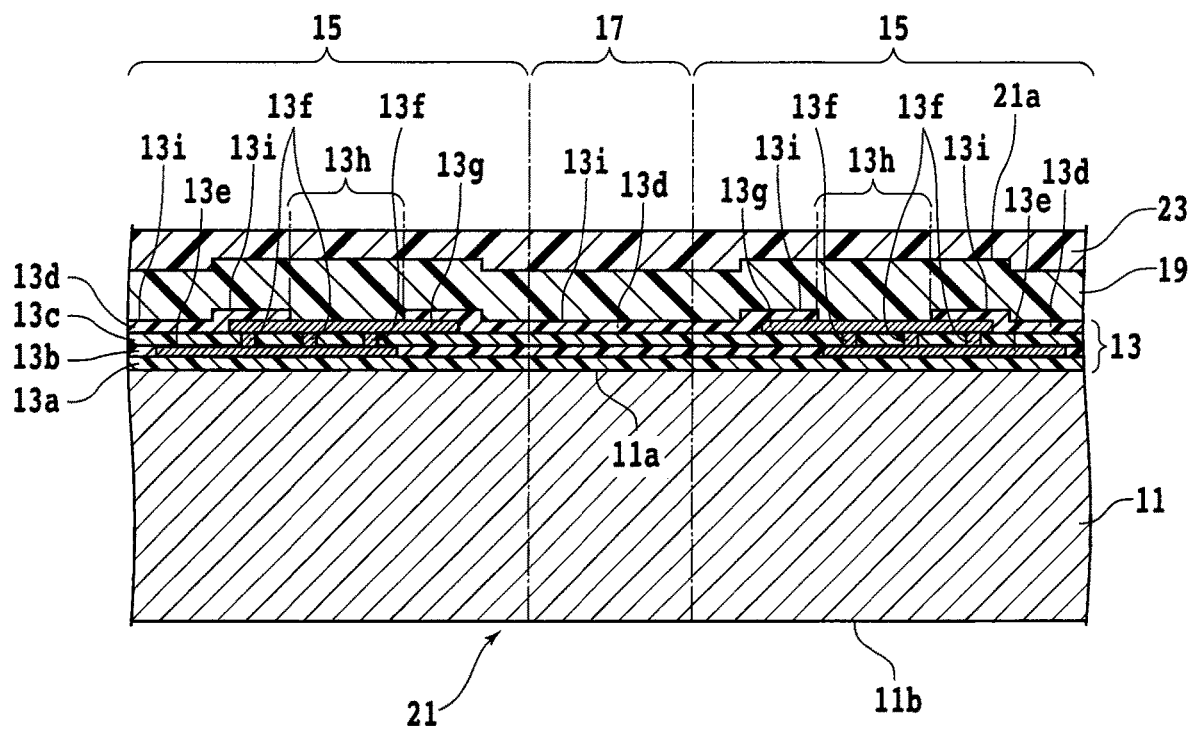
FIG. 3 is a sectional view of the device wafer, illustrating a water-soluble resin layer forming step (S30) according to the first preferred embodiment.

After performing the protective layer forming step (S20), the front side 21a of the device wafer 21 is covered with a water-soluble resin layer 23 by using a water-soluble resin applying and cleaning apparatus (not illustrated) (water-soluble resin layer forming step (S30)). FIG. 3 is a sectional view of the device wafer 21 processed by the water-soluble resin layer forming step (S30). In the water-soluble resin layer forming step (S30), a spinner table (not illustrated) having a holding surface for holding the device wafer 21 under suction is used. That is, the back side 11b of the device wafer 21 is held on the holding surface of the spinner table under suction. In this condition, the spinner table is rotated at 2000 rpm, for example. Thereafter, a water-soluble resin is applied to the center of the front side 21a of the device wafer 21 held on the spinner table being rotated, thereby forming the water-soluble resin layer 23 on the whole surface of the front side 21a of the device wafer 21. That is, the water-soluble resin layer 23 is formed by spin coating using the spinner table. Examples of the water-soluble resin include polyvinyl alcohol (PVA), polyethylene glycol (PEG), and polyethylene oxide (PEO).

Figure 4:
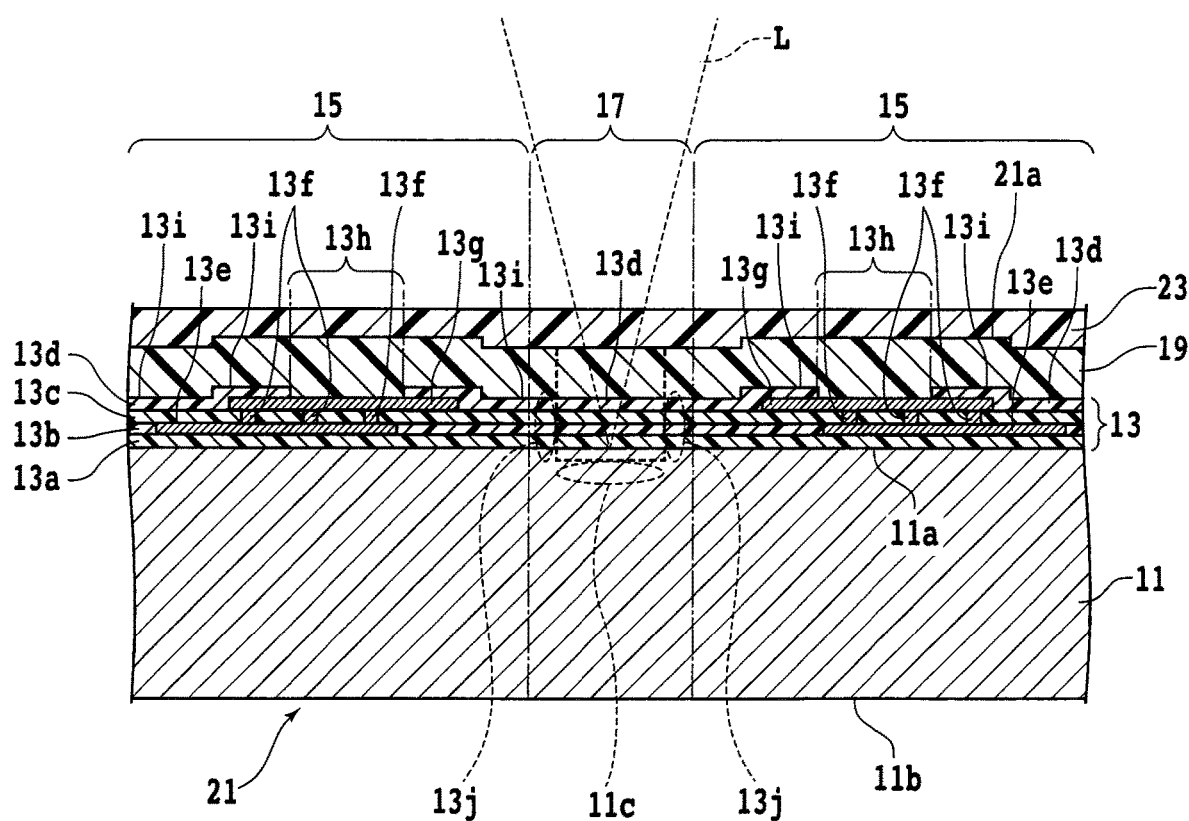
FIG. 4 is a sectional view of the device wafer, illustrating a laser processed groove forming step (S40) according to the first preferred embodiment.

After performing the water-soluble resin layer forming step (S30), a laser processed groove forming step (S40) is performed to apply a laser beam L along each division line 17. FIG. 4 is a sectional view of the device wafer 21, illustrating the laser processed groove forming step (S40). As illustrated in FIG. 4, a laser beam L is applied through the water-soluble resin layer 23 to the device wafer 21 along each division line 17, thereby forming a laser processed groove 25 (see FIG. 5) in an area illustrated by a broken line in the protective layer 19, the functional layer 13, and the semiconductor wafer 11 in FIG. 4. Further, when the laser beam L is applied to the device wafer 21, modified layers 13j are formed in the functional layer 13 along the side walls of each laser processed groove 25, and a distorted layer 11c is also formed at the bottom of each laser processed groove 25. In FIG. 4, the modified layers 13j and the distorted layer 11c are illustrated by broken lines. In the laser processed groove forming step (S40), the laser beam L having an absorption wavelength to the semiconductor wafer 11 and the functional layer 13 is applied to the device wafer 21 along each division line 17. For example, the laser beam L is a pulsed laser beam having a wavelength of ultraviolet light.

In the laser processed groove forming step (S40), the laser beam L is applied to the device wafer 21 along each division line 17, thereby performing ablation to the protective layer 19, the functional layer 13, and the front side 11a of the semiconductor wafer 11 at the position corresponding to each division line 17. That is, the protective layer 19, the functional layer 13, and the front side 11a of the semiconductor wafer 11 are partially removed along the division line 17 by performing ablation to thereby expose the front side 11a of the semiconductor wafer 11. That is, the laser processed groove 25 is formed along each division line 17 so as to partially expose the front side 11a of the semiconductor wafer 11. When the semiconductor wafer 11, the functional layer 13, and the protective layer 19 are partially removed by ablation, debris is usually generated to scatter around each laser processed groove 25. However, in this preferred embodiment, the debris scatters on the water-soluble resin layer 23 formed on the protective layer 19 as illustrated in FIG. 4, so that the adherence of the debris to the protective layer 19 can be prevented. Furthermore, the debris adhered to the water-soluble resin layer 23 can be removed together with the water-soluble resin layer 23 in a cleaning step (S50) to be described later.

Figure 5:
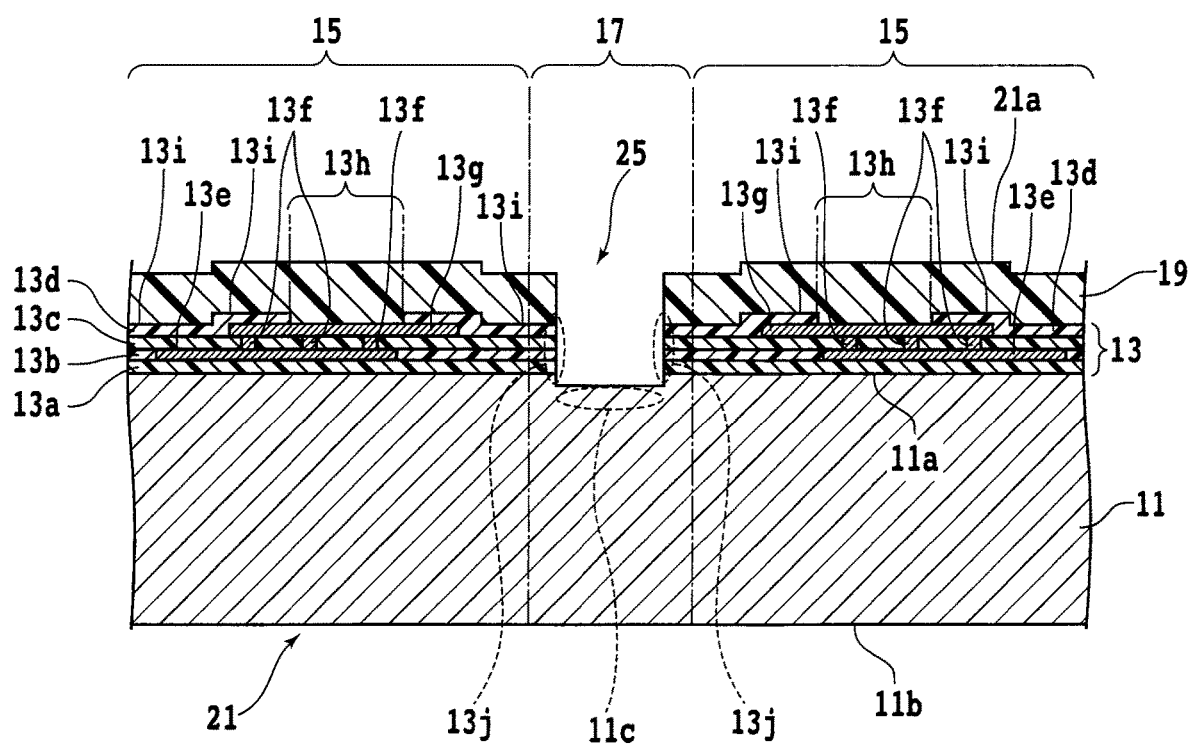
FIG. 5 is a sectional view of the device wafer, illustrating a cleaning step (S50) according to the first preferred embodiment.

After performing the laser processed groove forming step (S40), a cleaning step (S50) is performed to clean the device wafer 21 and thereby remove the debris generated in the laser processed groove forming step (S40) together with the water-soluble resin layer 23. FIG. 5 is a sectional view of the device wafer 21 in the condition where the water-soluble resin layer 23 has been removed in the cleaning step (S50). In the cleaning step (S50), the back side 1ib of the device wafer 21 is held under suction on the holding surface of the spinner table (not illustrated) in the water-soluble resin applying and cleaning apparatus used in the water-soluble resin layer forming step (S30), and the spinner table is rotated. Thereafter, a cleaning liquid (e.g., pure water) is sprayed to the device wafer 21 held on the spinner table being rotated. Accordingly, the water-soluble resin layer 23 can be removed from the device wafer 21. Further, the debris generated by the application of the laser beam L can also be removed together with the water-soluble resin layer 23. While the water-soluble resin layer forming step (S30) and the cleaning step (S50) are performed in this preferred embodiment, these steps (S30 and S50) may be omitted in the case that it is unnecessary to obtain the effects of the water-soluble resin layer 23, that is, the effect of preventing the scatter of the debris and the effect of promoting the removal of the debris.

Figure 6:
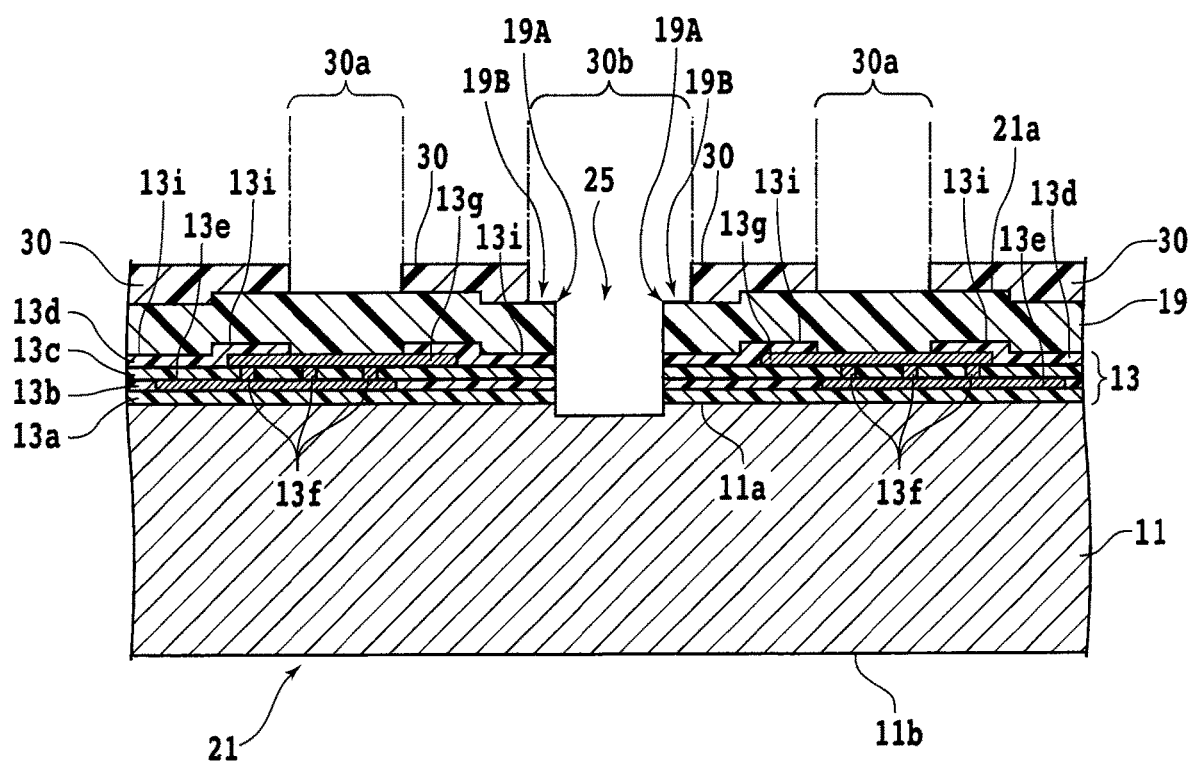
FIG. 6 is a sectional view of the device wafer, illustrating a mask layer forming step (S60) according to the first preferred embodiment.

After performing the cleaning step (S50), a mask layer 30 is formed on the protective layer 19 (mask layer forming step (S60)). FIG. 6 is a sectional view of the device wafer 21 in the condition where the mask layer 30 has been formed in the mask layer forming step (S60). For example, the mask layer 30 is a photoresist layer for use in a photolithography step. The mask layer 30 has a plurality of openings 30a and 30b. As illustrated in FIG. 6, each opening 30a is an opening formed directly above each metal electrode 13g, in which this opening is smaller in width than each metal electrode 13g. Further, each opening 30b is an opening formed directly above each laser processed groove 25, in which this opening is larger in width than each laser processed groove 25. That is, the edge portion of the mask layer 30 forming each opening 30b in the vicinity of each laser processed groove 25 is retracted from the edge portion 19A of the protective layer 19 forming each laser processed groove 25. The edge portion 19A of the protective layer 19 corresponds to the edge portion of each laser processed groove 25.

In other words, the upper surface 19B of the protective layer 19 in the vicinity of each laser processed groove 25 is exposed from the mask layer 30, that is, the upper surface 19B is not masked by the mask layer 30. In this manner, the width of each opening 30b of the mask layer 30 is set larger than the width of each laser processed groove 25. Accordingly, in an etching step to be described later, the distorted layer 11c formed at the bottom portion of each laser processed groove 25 and the modified layers 13j of the functional layer 13 can be easily removed. In particular, the semiconductor wafer 11 can be largely etched both in the direction along the depth of each laser processed groove 25 and in the direction along the width of each laser processed groove 25, so that the distorted layer 11c of the semiconductor wafer 11 in the vicinity of the bottom of each laser processed groove 25 can be completely removed. As a result, the die strength of each device chip to be obtained by performing a dividing step (S100) to be described later can be improved.

In the mask layer forming step (S60), a positive photoresist layer is first formed on the whole surface of the front side 21a of the device wafer 21 by a coating method using a spin coater. Thereafter, the photoresist layer is exposed to light by using a photomask, and next baked at a suitable temperature. Thereafter, the photoresist layer baked is developed to remove a photosensitized area. Accordingly, the area corresponding to each laser processed groove 25 and the area corresponding to a part of each metal electrode 13g of the functional layer 13 are removed from the photoresist layer to thereby form the mask layer 30 covering the protective layer 19 except the area directly above each metal electrode 13g. At this time, a part of the mask layer 30 in the vicinity of each laser processed groove 25 is also removed, so that the upper surface 19B of the protective layer 19 near the edge portion 19A thereof is exposed from the mask layer 30, that is, the upper surface 19B is not masked by the mask layer 30.

Figure 7:
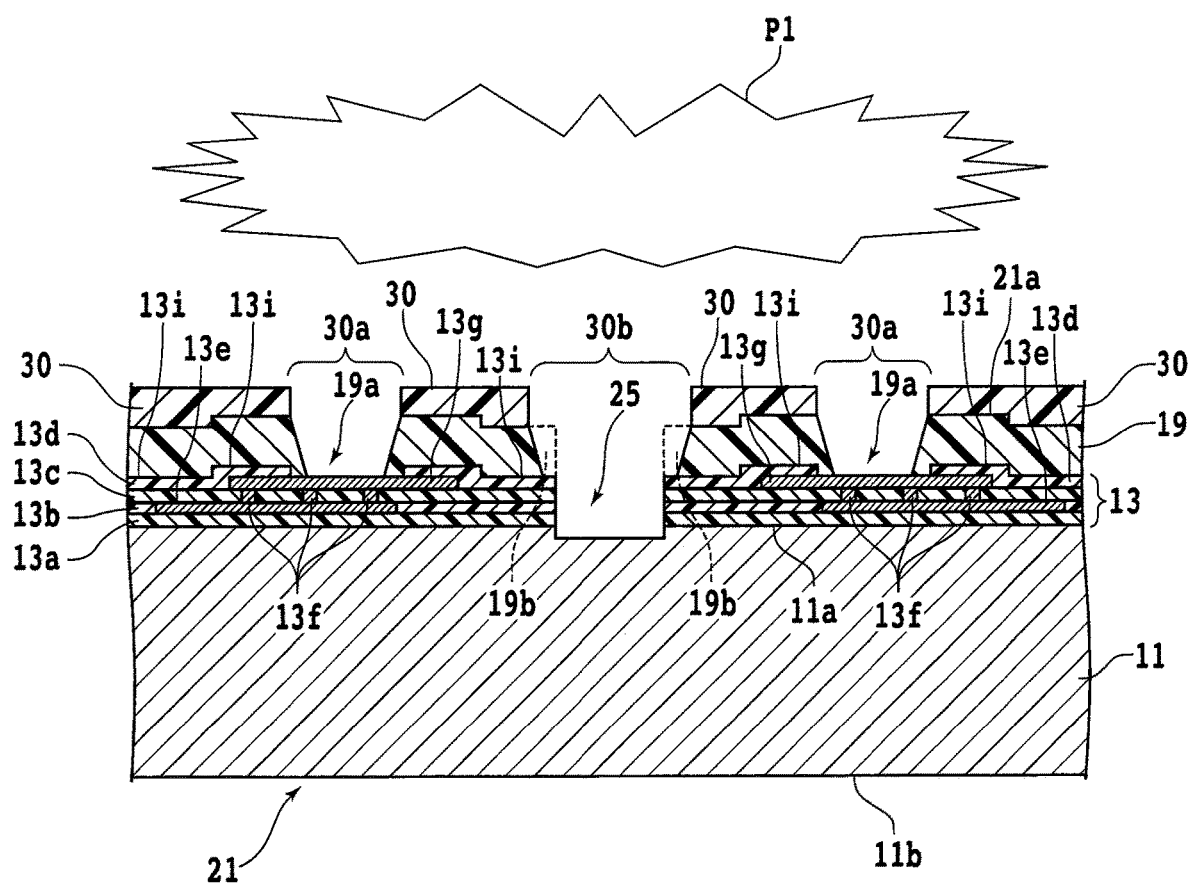
FIG. 7 is a sectional view of the device wafer, illustrating a first etching step (S70) according to the first preferred embodiment.

After performing the mask layer forming step (S60), plasma etching is performed through the mask layer 30 to thereby partially remove the protective layer 19. Accordingly, each metal electrode 13g of the functional layer 13 is exposed from the protective layer 19. FIG. 7 is a sectional view of the device wafer 21, illustrating a first etching step (S70). In FIG. 7, a plasma P1 generated in the first etching step (S70) is schematically illustrated. In the first etching step (S70), a first gas is used to perform plasma etching through the mask layer 30 to the protective layer 19. For example, oxygen gas (02 gas) is used as the first gas. The interatomic bond of the oxygen molecule is cut by a plasma chemical reaction to thereby produce atomic oxygen as radical species that is a reactive and short-life intermediate. Then, the atomic oxygen as radical species produced above reacts with the organic protective layer 19 to produce a gas containing water and carbon dioxide from the protective layer 19, and this gas is released. Accordingly, the protective layer 19 is etched off at the position directly below each opening 30a of the mask layer 30, thereby forming an etched-off area 19a (hole) directly below each opening 30a. Each hole 19a has tapered side surfaces in such a manner that the width of each hole 19a decreased toward the bottom.

Figure 8:
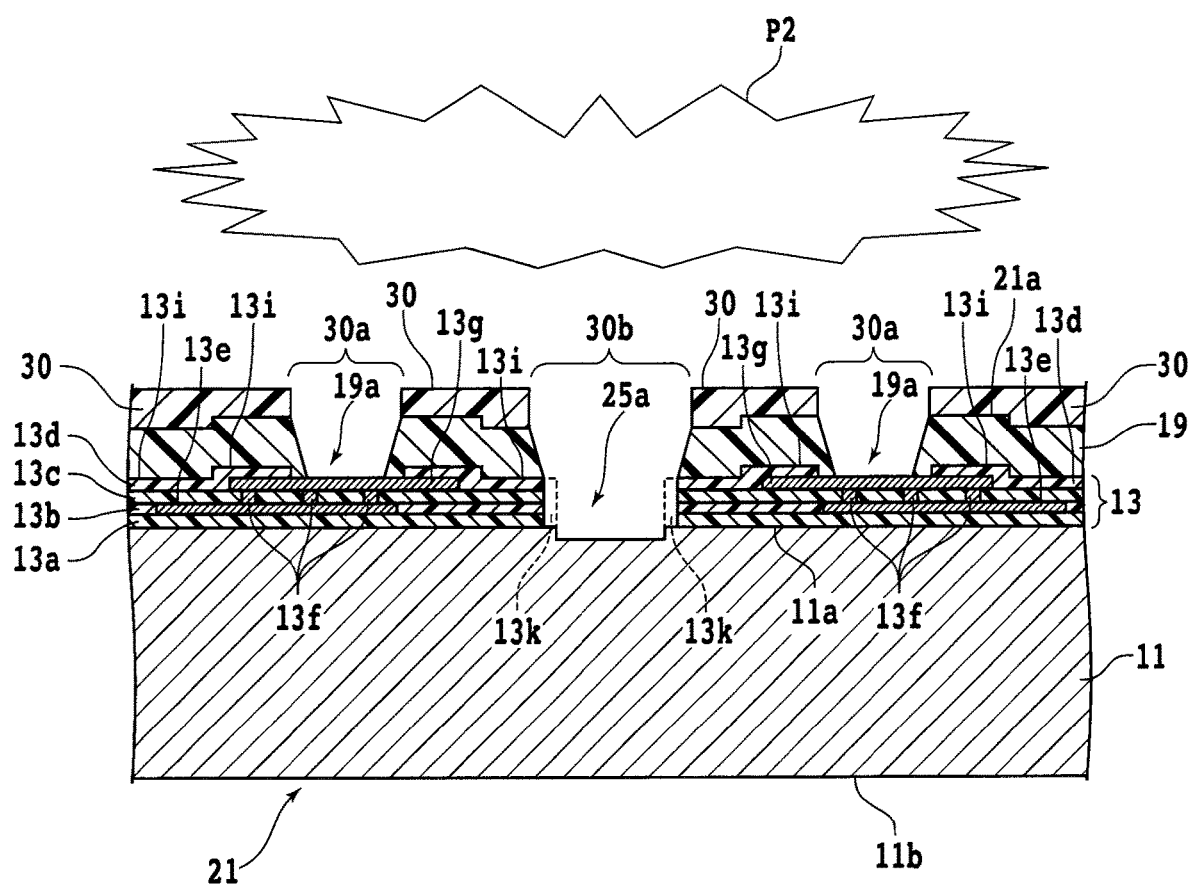
FIG. 8 is a sectional view of the device wafer, illustrating the first half (S80-1) of a second etching step according to the first preferred embodiment.

Further, the protective layer 19 is also etched off at the position directly below each opening 30b of the mask layer 30 in the periphery of the side walls of each laser processed groove 25 (including the upper surfaces 19B of the protective layer 19), thereby forming a pair of etched-off areas 19b (vacancy) along each laser processed groove 25 as illustrated by broken lines in FIG. 7. Each etched-off area 19b also has a tapered side surface in such a manner that the width of each laser processed groove 25 decreases toward the bottom. After performing the first etching step (S70), a second etching step (S80-1 and S80-2) is performed by using the mask layer 30 to thereby remove the modified layers 13j of the functional layer 13 along the side walls of each laser processed groove 25 and the distorted layer 11c of the semiconductor wafer 11 along the bottom of each laser processed groove 25. In this preferred embodiment, the second etching step (S80-1 and S80-2) is composed of a first half (S80-1) and a second half (S80-2). In the first half (S80-1) of the second etching step, the modified layers 13j of the functional layer 13 along the side walls of each laser processed groove 25 are removed. FIG. 8 is a sectional view of the device wafer 21, illustrating the first half (S80-1) of the second etching step. In FIG. 8, a plasma P2 generated in the first half (S80-1) of the second etching step is schematically illustrated.

In the first half (S80-1), the modified layers 13j formed in the side portions of the functional layer 13 exposed to each laser processed groove 25 are etched off to thereby form a pair of etched-off areas 13k (vacancy) along the side walls of each laser processed groove 25 as illustrated by broken lines in FIG. 8. Accordingly, the width of each laser processed groove 25 is increased to form a first expanded groove 25a. The side surface of the stack of the first, second, third, and fourth insulating films 13a, 13b, 13c, and 13d as the stack of four low-k films forming the functional layer 13 is exposed to each first expanded groove 25a. In the case that each low-k film of the functional layer 13 is an oxide film such as a carbon containing silicon oxide film (SiOCH film), a gas containing perfluorocyclobutane ($C_4F_8$) or sulfur hexafluoride ($SF_6$), for example, is used to perform plasma etching to the stack of four low-k films forming the functional layer 13. In the case that each low-k film of the functional layer 13 is an organic film, a gas containing hydrogen ($H_2$) and nitrogen ($N_2$), for example, is used to perform plasma etching to the stack of four low-k films forming the functional layer 13.

Figure 9:
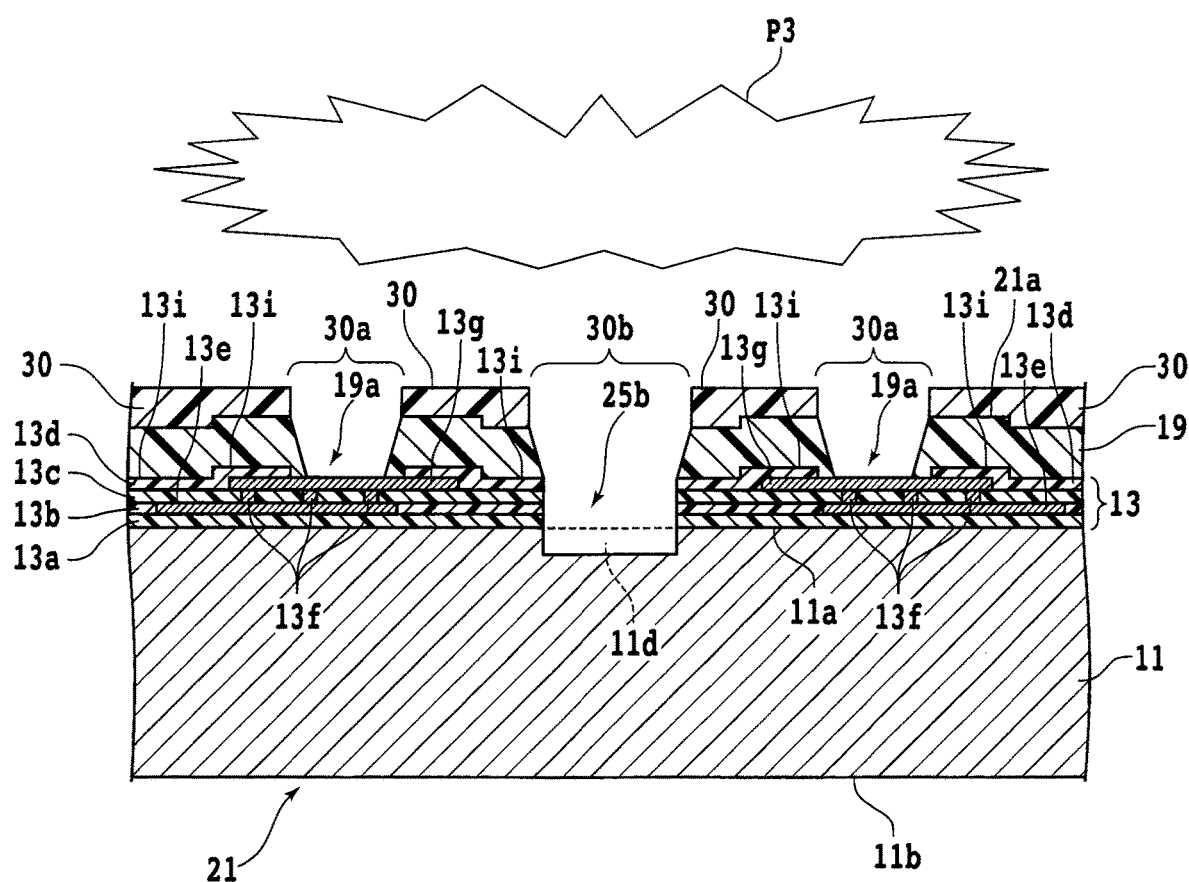
FIG. 9 is a sectional view of the device wafer, illustrating the second half (S80-2) of the second etching step according to the first preferred embodiment.

After performing the first half (S80-1) of the second etching step to remove the modified layers 13j in the functional layer 13 along each laser processed groove 25, the second half (S80-2) of the second etching step is performed to remove the distorted layer 11c formed in the semiconductor wafer 11 along the bottom of each laser processed groove 25. FIG. 9 is a sectional view of the device wafer 21, illustrating the second half (S80-2) of the second etching step. In FIG. 9, a plasma P3 generated in the second half (S80-2) of the second etching step is schematically illustrated. In the second half (S80-2), the upper portion of the semiconductor wafer 11 exposed to each laser processed groove 25 (that is, the front side portion of the semiconductor wafer 11 corresponding to the bottom of each laser processed groove 25) is etched off to remove the distorted layer 11c, thereby forming an etched-off area 11d (vacancy) along the bottom of each laser processed groove 25 as illustrated by a broken line in FIG. 9. Accordingly, the depth and width of each laser processed groove 25 are increased to form a second expanded groove 25b. In this preferred embodiment, the semiconductor wafer 11 is formed of silicon, so that a gas containing perfluorocyclobutane ($C_4F_8$) or sulfur hexafluoride ($SF_6$), for example, is used to perform plasma etching to the semiconductor wafer 11.

As a mixed gas for use in the first half (S80-1) and the second half (S80-2) of the second etching step, various combinations of gases may be adopted. For example, in the case that each low-k film is a carbon containing silicon oxide film (SiOCH film), the same gas is used both in the first half (S80-1) and in the second half (S80-2). In the case that each low-k film is an organic film, different gases are used in the first half (S80-1) and the second half (S80-2). In general, a second gas different from the first gas used in the first etching step (S70) is used in the second etching step (S80-1 and S80-2). However, the first gas in the first etching step (S70) of removing the protective layer 19 may be the same as the second gas in the first half (S80-1) of removing the low-k films of the functional layer 13.

In the first half (S80-1) and the second half (S80-2), plasma etching is performed through the mask layer 30 used in the first etching step (S70) of removing the protective layer 19. That is, it is unnecessary to perform an additional mask layer forming step for the removal of the modified layers 13*j* and the distorted layer 11*c* along each laser processed groove 25 after performing the laser processed groove forming step (S40) and before performing a dividing step (S100) of the semiconductor wafer 11 to be described later. In other words, the modified layers 13*j* and the distorted layer 11*c* can be etched off by using the mask layer 30 used in the first etching step (S70) of removing the protective layer 19. As described above, the edge portion of the mask layer 30 near each laser processed groove 25 is retracted from the edge portion 19A of the protective layer 19 in the mask layer forming step (S60). Accordingly, as compared with the case that the edge portion of the mask layer 30 near each laser processed groove 25 is not retracted from the edge portion 19A of the protective layer 19, the distorted layer 11*c* can be removed more largely both in the direction along the depth of each laser processed groove 25 and in the direction along the width of each laser processed groove 25.

Figure 10:
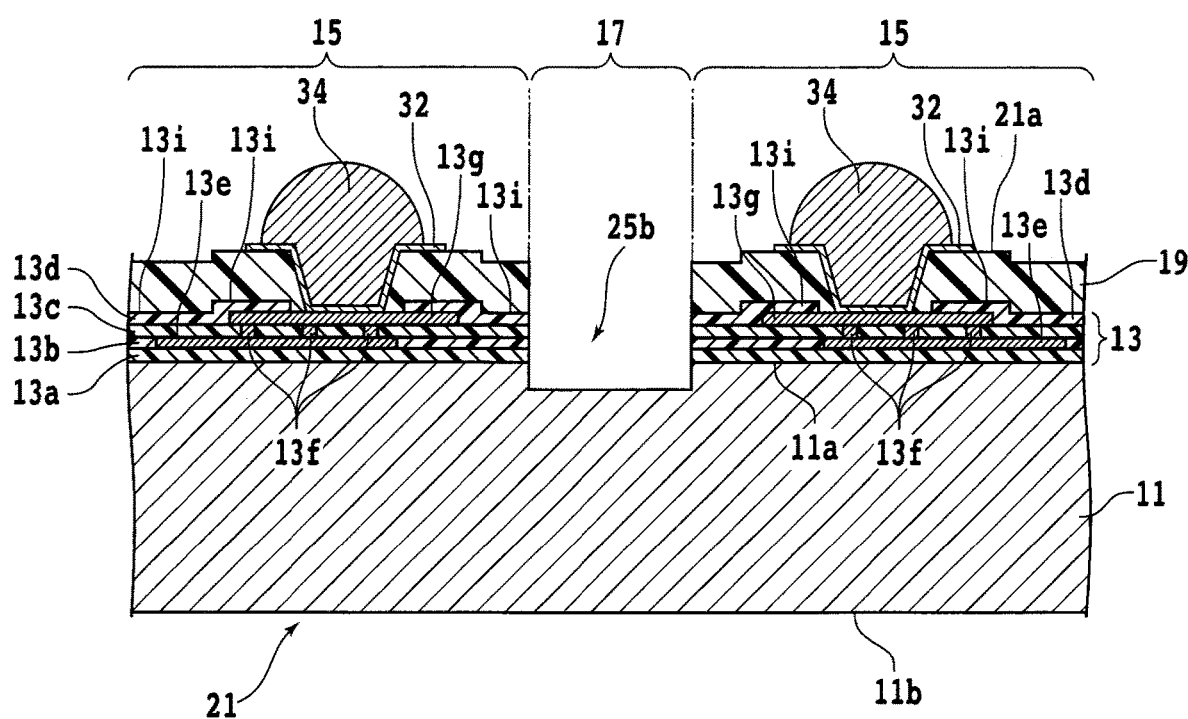
FIG. 10 is a sectional view of the device wafer, illustrating a bump forming step (S90) according to the first preferred embodiment.

After performing the second etching step (S80-1 and S80-2) to remove the modified layers 13*j* and the distorted layer 11*c* along each laser processed groove 25, the mask layer 30 is removed, and a bump 34 is next formed on each metal electrode 13*g* of the functional layer 13 in a bump forming step (S90) as illustrated in FIG. 10. FIG. 10 is a sectional view of the device wafer 21, illustrating the bump forming step (S90). Prior to forming the bump 34, a primary metal layer 32 is formed on each metal electrode 13*g* in contact therewith through the corresponding etched-off area 19*a* of the protective layer 19. The primary metal layer 32 is a layer having a metal multilayer structure composed of a nickel (Ni) layer connected to each metal electrode 13*g*, a palladium (Pd) layer formed on the nickel layer, and a gold (Au) layer formed on the palladium layer. The bump 34 of metal is next formed on the primary metal layer 32. While the bump 34 is formed of gold, for example, the bump 34 may be formed of any other metals such as silver (Ag), copper (Cu), nickel, and solder (alloy containing tin (Sn), for example).

In the bump forming step (S90), the primary metal layer 32 is first formed by plating. For example, a nickel layer, a palladium layer, and a gold layer are formed in this order by plating. As a modification, the primary metal layer 32 may be formed by sputtering and photolithography. In this modification, a layer having the above-mentioned metal multilayer structure is first formed on the whole upper surface of the protective layer 19 by sputtering. Thereafter, this layer having the metal multilayer structure is suitably patterned by performing photolithography in such a manner that this layer is left inside the etched-off area 19*a* and in the periphery of the etched-off area 19*a*. After forming the primary metal layer 32, the bump 34 is formed on the primary metal layer 32 by plating. Thereafter, the bump 34 is heated and thereby made to reflow. Accordingly, each bump 34 has a substantially spherical surface as illustrated in FIG. 10. After performing the bump forming step (S90), the semiconductor wafer 11 is divided along each laser processed groove 25 expanded by performing the second etching step (S80-1 and S80-2), thereby obtaining a plurality of device chips 21*b* (see FIG. 12).

Figure 11A:
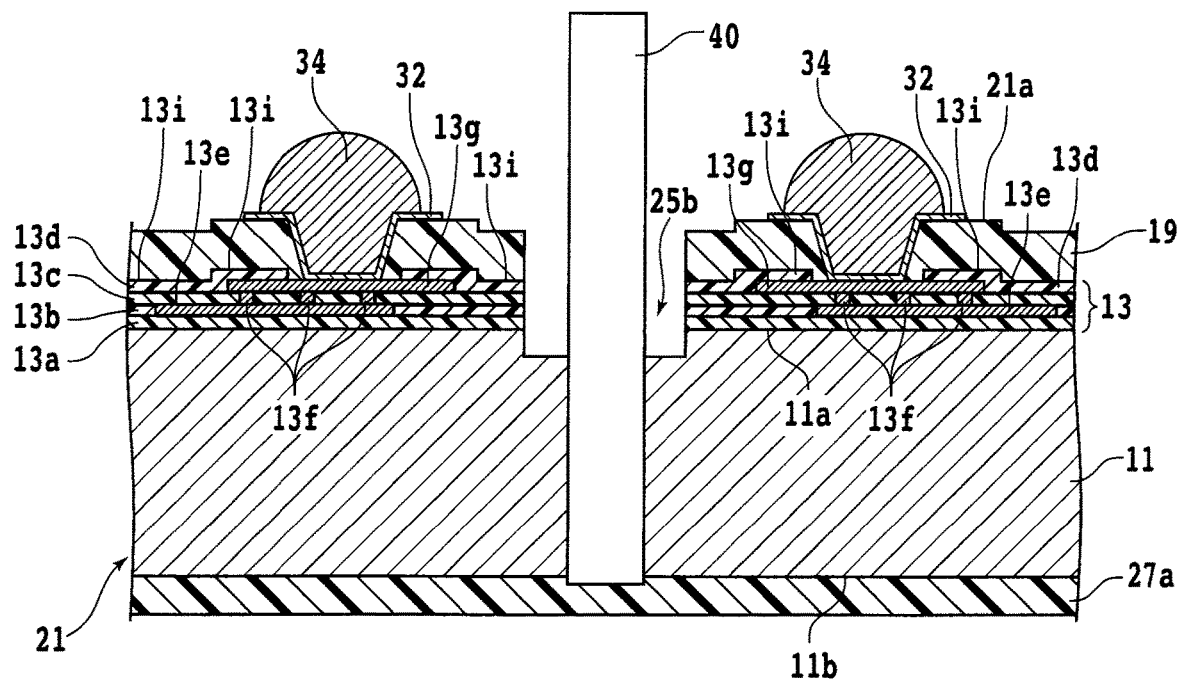
FIG. 11A is a sectional view of the device wafer, illustrating a dividing step (S100) according to the first preferred embodiment.
Figure 11B:
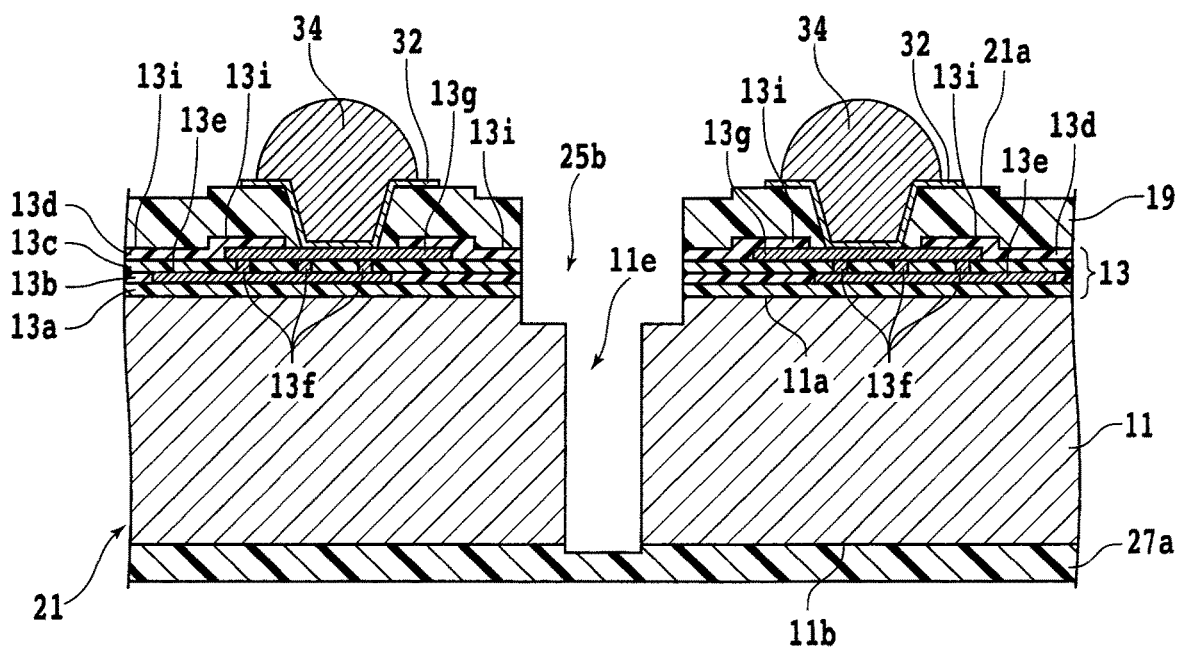
FIG. 11B is a sectional view of the device wafer divided by performing the dividing step illustrated in FIG. 11A.

FIG. 11A is a sectional view of the device wafer 21, illustrating a dividing step (S100), and FIG. 11B is a sectional view of the device wafer 21 processed by the dividing step (S100). FIG. 12 is a perspective view of a wafer unit 29 formed by supporting the device wafer 21 through a support tape 27*a* to a metal annular frame 27*b* in the condition where the dividing step (S100) has been finished. The support tape 27*a* is formed of resin, for example, and it has a substantially circular shape as viewed in plan. The support tape 27*a* is composed of a base layer and an adhesive layer formed on the whole surface of one side of the base layer. The adhesive layer is formed of UV curable resin that can be cured by ultraviolet light, for example. As illustrated in FIG. 12, the device wafer 21 is attached to a central portion of the adhesive layer of the circular support tape 27*a*, and the annular frame 27*b* is attached to a peripheral portion of the adhesive layer of the support tape 27*a*. The annular frame 27*b* has a circular inside opening for accommodating the device wafer 21. The circular support tape 27*a* has a diameter larger than the diameter of the circular inside opening of the annular frame 27*b*. The diameter of the device wafer 21 is smaller than the diameter of the circular inside opening. Accordingly, the adhesive layer of the support tape 27*a* is exposed to the inside opening of the annular frame 27*b* in an annular area defined between the device wafer 21 and the annular frame 27*b*.

The dividing step (S100) in this preferred embodiment is a cutting step of cutting the semiconductor wafer 11 by using an annular cutting blade 40. The cutting blade 40 is formed by fixing abrasive grains such as diamond abrasive grains with a bond such as a metal bond. In the dividing step (S100), the back side 11*b* of the semiconductor wafer 11, that is, the back side of the device wafer 21, is attached to the central portion of the support tape (dicing tape) 27*a* (see FIG. 12), in which the annular frame 27*b* is previously attached to the peripheral portion of the support tape 27*a*. Thereafter, the cutting blade 40 is rotated at a high speed and then lowered to cut the front side 11*a* of the semiconductor wafer 11 along each laser processed groove 25 (i.e., along each second expanded groove 25*b*) as relatively moving the cutting blade 40 and the semiconductor wafer 11 in a direction parallel to each division line 17. At this time, the semiconductor wafer 11 is fully cut by the cutting blade 40. Accordingly, as illustrated in FIG. 11B, a cut groove 11*e* having a depth from the front side 11*a* of the semiconductor wafer 11 to the back side 11*b* thereof is formed along each laser processed groove 25. That is, a plurality of cut grooves 11*e* are formed along all of the crossing division lines 17 of the semiconductor wafer 11, respectively, as illustrated in FIG. 12. As compared with the case that the edge portion of the mask layer 30 near each laser processed groove 25 is not retracted from the edge portion 19A of the protective layer 19 in the mask layer forming step (S60), the distorted layer 11*c* of the semiconductor wafer 11 along each laser processed groove 25 can be removed more completely in this preferred embodiment. Accordingly, the die strength of each device chip 21*b* can be improved.

Figure 14:
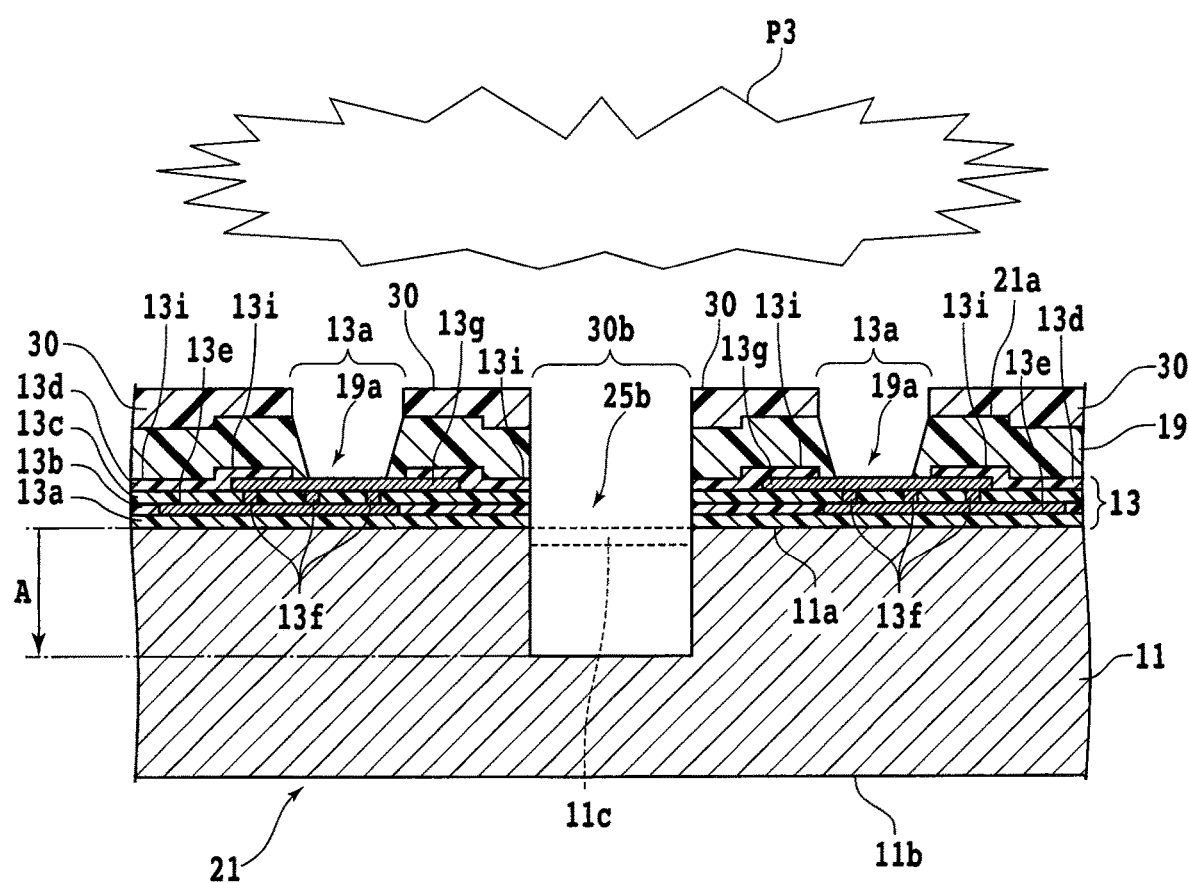
FIG. 14 is a sectional view of the device wafer, illustrating the second half (S80-2) of a second etching step according to a second preferred embodiment of the present invention.

There will now be described a second preferred embodiment of the present invention with reference to FIGS. 14 and 15. In the second preferred embodiment, plasma etching is performed along each laser processed groove 25 more deeply than in the first preferred embodiment in the second half (S80-2) of the second etching step. FIG. 14 is a sectional view of the device wafer 21, illustrating the second half (S80-2) of the second etching step according to the second preferred embodiment. In the second half (S80-2) of the second etching step according to the second preferred embodiment, each laser processed groove 25 is expanded so as to have a depth from the front side 11*a* of the semiconductor wafer 11 to a position not reaching the back side 11*b* of the semiconductor wafer 11, in which this depth is larger than a finished thickness A of each device chip 21*b*. The finished thickness A is the thickness of the semiconductor wafer 11 divided by performing the dividing step (S100) to obtain the device chips 21b. In this preferred embodiment, the finished thickness A is larger than the depth of the distorted layer 11c from the front side 11a and smaller than the original thickness of the semiconductor wafer 11 before performing the dividing step (S100).

In the second half (S80-2) according to the second preferred embodiment, at least one of the processing conditions for plasma etching is changed. For example, the concentration of perfluorocyclobutane ($C_4F_8$) or sulfur hexafluoride ($SF_6$) is increased, the electric power to be applied is increased, or the duration of plasma etching is increased. By changing at least one of these processing conditions in this manner, the semiconductor wafer 11 can be etched deeply as compared with the second half (S80-2) according to the first preferred embodiment. Accordingly, each laser processed groove 25 can be expanded in the direction along the depth to thereby form a second expanded groove 25b having a depth larger than the finished thickness A as illustrated in FIG. 14. Thereafter, as illustrated in FIG. 15, the back side 11b of the semiconductor wafer 11 is ground until the thickness of the semiconductor wafer 11 becomes the finished thickness A, thereby dividing the semiconductor wafer 11 along each laser processed groove 25 (i.e., along each second expanded groove 25b) expanded by the second etching step (S80-1 and S80-2).

Figure 15:
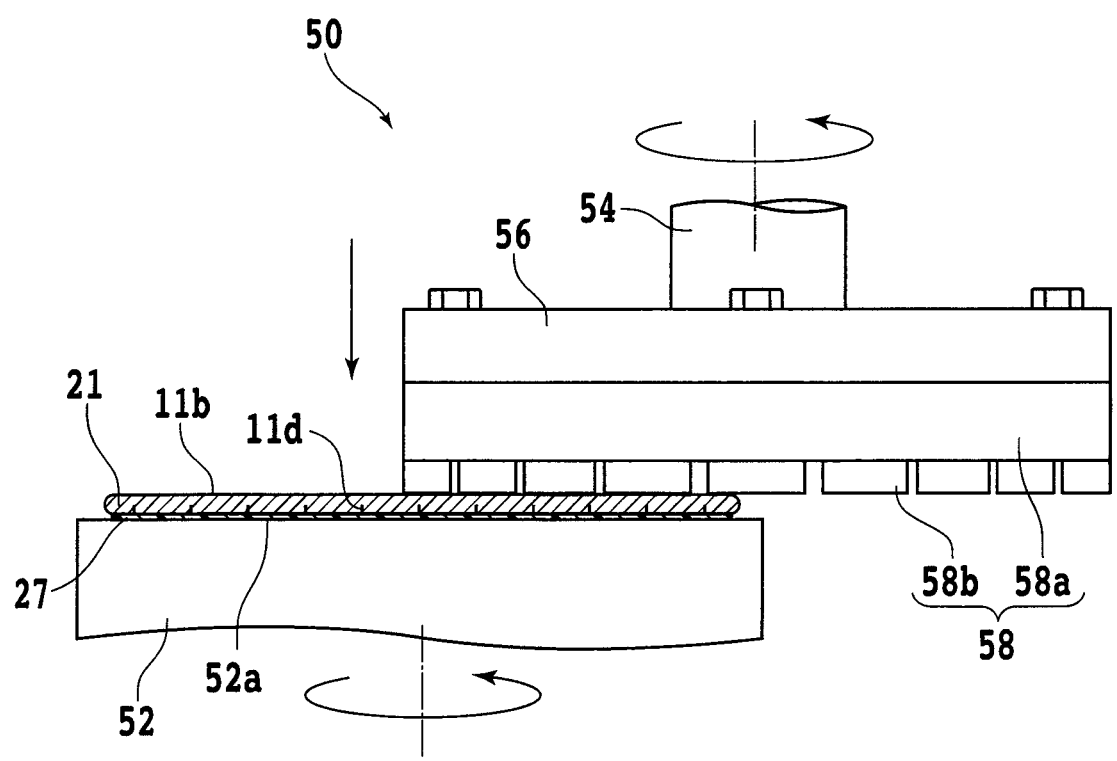
FIG. 15 is a partially sectional side view illustrating a dividing step (S100) according to the second preferred embodiment.

FIG. 15 is a partially sectional side view illustrating a dividing step (S100) according to the second preferred embodiment. In the second preferred embodiment, the dividing step (S100) is performed by using a grinding apparatus 50 for grinding the back side 11b of the semiconductor wafer 11 as illustrated in FIG. 15. The structure of the grinding apparatus 50 will now be described with reference to FIG. 15. The grinding apparatus 50 includes a chuck table 52 for holding the device wafer 21 under suction. Prior to performing the dividing step (S100), the central portion of the support tape 27a is attached to the front side 21a of the device wafer 21, in which the annular frame 27b is previously attached to the peripheral portion of the support tape 27a. Accordingly, the device wafer 21 is supported through the support tape 27a to the annular frame 27b in the condition where the back side 11b of the semiconductor wafer 11 of the device wafer 21 is exposed.

The chuck table 52 is connected to a rotating mechanism (not illustrated) such as a motor, so that the chuck table 52 is rotatable about its vertical axis Z1. The chuck table 52 has an upper surface as a holding surface 52a for holding the front side 21a of the device wafer 21. The holding surface 52a is connected through a suction passage (not illustrated) to a vacuum source (not illustrated), in which the suction passage is formed inside the chuck table 52. Accordingly, a vacuum produced by the vacuum source is adapted to be applied through the suction passage to the holding surface 52a, thereby generating a suction force for holding the front side 21a of the device wafer 21 under suction.

While the front side 21a of the device wafer 21 is attached to the central portion of the support tape 27a supported at its peripheral portion to the annular frame 27b as described above, the annular frame 27b is not illustrated in FIG. 15. The grinding apparatus 50 further includes a grinding mechanism provided above the chuck table 52 so as to be opposed to the back side 11b of the semiconductor wafer 11 of the device wafer 21 held on the chuck table 52. The grinding mechanism includes a spindle 54 rotatable about its vertical axis Z2. The spindle 54 is vertically movable by an elevating mechanism (not illustrated). A disk-shaped wheel mount 56 is fixed to the lower end of the spindle 54. An annular grinding wheel 58 is mounted on the lower surface of the wheel mount 56, in which the grinding wheel 58 has an outer diameter substantially equal to the diameter of the wheel mount 56. The grinding wheel 58 includes an annular wheel base (annular base) 58a formed of metal such as aluminum and stainless steel.

The upper surface of the wheel base 58a is fixed to the lower surface of the wheel mount 56, so that the wheel base 58a is fixedly mounted to the spindle 54. Further, the grinding wheel 58 further includes a plurality of abrasive members (grinding chips) 58b fixed to the lower surface of the wheel base 58a. Each abrasive member 58b has a shape like a rectangular prism. The plural abrasive members 58b are annularly arranged at given intervals on the lower surface of the annular wheel base 58a along the whole of the outer circumference thereof. Each abrasive member 58b is formed by mixing abrasive grains of diamond or cubic boron nitride (cBN), for example, in a bond formed of metal, ceramic, or resin, for example. However, the abrasive grains and the bond are not limited in kind, but they may be suitably selected according to the specifications of each abrasive member 58b.

In the dividing step (S100) according to the second preferred embodiment, the semiconductor wafer 11 is ground by using the grinding apparatus 50. More specifically, the device wafer 21 is first held through the support tape 27a on the chuck table 52 under suction in the condition where the back side 11b of the semiconductor wafer 11 of the device wafer 21 is exposed upward. In this condition, the chuck table 52 is rotated about the axis Z1 at a predetermined speed in a predetermined direction, and the spindle 54 is also rotated about the axis Z2 at a predetermined speed in the predetermined direction illustrated by an arrow Q in FIG. 15. Thereafter, the spindle 54 is lowered until the abrasive members 58b come into abutment against the back side 11b of the semiconductor wafer 11. Thereafter, the spindle 54 is further lowered to grind the back side 11b of the semiconductor wafer 11 until the thickness of the semiconductor wafer 11 becomes the finished thickness A illustrated in FIG. 14. When the thickness of the semiconductor wafer 11 has reached the finished thickness A, the device wafer 21 is divided along each division line 17 to obtain the device chips 21b separated from each other. After dividing the device wafer 21 into the device chips 21b attached to the support tape 27a, the support tape 27a may be expanded by using a tape expander (not illustrated) to thereby increase the spacing between any adjacent ones of the device chips 21b. In this case, each device chip 21b can be easily picked up from the support tape 27a in the subsequent step. Further, the structure and method in the second preferred embodiment may be suitably modified without departing from the scope of the object of the present invention. For example, the second half (S80-2) of the second etching step according to the second preferred embodiment may be modified in such a manner that plasma etching is continued after the depth of each laser processed groove 25 becomes larger than the finished thickness A, thereby dividing the semiconductor wafer 11. That is, the semiconductor wafer 11 may be etched until it is divided along each laser processed groove 25. In this manner, the semiconductor wafer 11 may be divided by the second half (S80-2) of the second etching step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer processing method comprising:
a device forming step of forming a functional layer on a front side of a semiconductor wafer, the functional layer having a first area where a plurality of semiconductor devices are formed and a second area where a plurality of division lines for separating the plurality of semiconductor devices from each other are formed, each semiconductor device including a distribution layer and a metal electrode formed above the distribution layer;
a protective layer forming step of forming an protective layer on a front side of the functional layer to fully cover the front side of the functional layer with the protective layer, thereby forming a device wafer having the semiconductor wafer, the functional layer, and the protective layer;
a laser processed groove forming step of applying a laser beam having an absorption wavelength to the functional layer and the semiconductor wafer along each division line to partially remove the semiconductor wafer, the protective layer, and the functional layer, and thereby expose the front side of the semiconductor wafer, thereby forming a laser processed groove along each division line on a front side of the device wafer;
a mask layer forming step of forming a mask layer on a front side of the protective layer except in an area above each metal electrode;
a first etching step of performing plasma etching using a first gas through the mask layer to the protective layer, thereby exposing each metal electrode;
a second etching step of performing plasma etching using a second gas to each laser processed groove through the mask layer used in the first etching step, thereby partially removing the functional layer and the semiconductor wafer exposed from the mask layer to thereby expand each laser processed groove both along its width and along its depth; and
a dividing step of dividing the semiconductor wafer along each laser processed groove expanded in the second etching step, thereby obtaining a plurality of device chips respectively including the plurality of semiconductor devices.

2. The semiconductor wafer processing method according to claim 1, wherein
the mask layer formed in the mask layer forming step has an edge portion in a vicinity of each laser processed groove, the edge portion of the mask layer being retracted from an edge portion of each laser processed groove, and
an upper surface of the protective layer in the vicinity of each laser processed groove is exposed from the mask layer.

3. The semiconductor wafer processing method according to claim 1, further comprising:
a water-soluble resin layer forming step of forming a water-soluble resin layer on the front side of the device wafer after performing the protective layer forming step and before performing the laser processed groove forming step; and
a cleaning step of cleaning the device wafer after performing the laser processed groove forming step and before performing the mask layer forming step, thereby removing the water-soluble resin layer together with debris generated in the laser processed groove forming step.

4. The semiconductor wafer processing method according to claim 1, wherein
the dividing step includes a cutting step of using a cutting blade to cut the semiconductor wafer along each laser processed groove expanded in the second etching step.

5. The semiconductor wafer processing method according to claim 1, wherein
each laser processed groove expanded in the second etching step has a depth from the front side of the semiconductor wafer to a position not reaching a back side of the semiconductor wafer, the depth being larger than a finished thickness of each device chip, and
the dividing step includes a grinding step of grinding the back side of the semiconductor wafer until the thickness of the semiconductor wafer becomes the finished thickness, thereby dividing the semiconductor wafer along each laser processed groove expanded in the second etching step.

6. The semiconductor wafer processing method according to claim 1, further comprising:
a bump forming step of forming a bump on each metal electrode exposed in the first etching step.

* * * * *